(12) United States Patent
Lee et al.

(10) Patent No.: US 12,400,879 B2
(45) Date of Patent: Aug. 26, 2025

(54) GAS TREATMENT SYSTEM AND GAS TREATMENT METHOD USING THE SAME

(71) Applicant: SAMSUNG ELECTRONICS CO., LTD., Suwon-si (KR)

(72) Inventors: Wonsu Lee, Seoul (KR); Kimoon Lee, Seoul (KR); Seungjun Lee, Hwaseong-si (KR); Jong san Chang, Suwon-si (KR); Joungwoo Han, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 499 days.

(21) Appl. No.: 18/049,954

(22) Filed: Oct. 26, 2022

(65) Prior Publication Data
US 2023/0274952 A1 Aug. 31, 2023

(30) Foreign Application Priority Data

Feb. 25, 2022 (KR) ......................... 10-2022-0025547
May 6, 2022 (KR) ......................... 10-2022-0056238

(51) Int. Cl.
*H01L 21/67* (2006.01)
*B01D 45/16* (2006.01)
(Continued)

(52) U.S. Cl.
CPC ........ *H01L 21/67017* (2013.01); *B01D 45/16* (2013.01); *B01D 53/1406* (2013.01); *B01D 53/1431* (2013.01); *B01D 53/1493* (2013.01); *B01D 53/18* (2013.01); *B01D 53/32* (2013.01); *B01D 53/75* (2013.01); *B01D 53/869* (2013.01); *F23C 13/00* (2013.01); *F23J 15/04* (2013.01); *F23J 15/06* (2013.01); *F23J 15/08* (2013.01); *H05H 1/2406* (2013.01); *B01D 2252/103* (2013.01); *B01D 2259/818* (2013.01); *F23G 2202/60* (2013.01); *F23G 2204/201* (2013.01); *F23J 2219/40* (2013.01); *H05H 2242/10* (2013.01); *H05H 2245/17* (2021.05)

(58) Field of Classification Search
CPC ......................... B01D 53/14; H01L 21/67017
See application file for complete search history.

(56) References Cited

U.S. PATENT DOCUMENTS 6,888,040 B1 * 5/2005 Shufflebotham .... C23C 16/4412
95/131
7,128,882 B2 10/2006 Tamata et al.
(Continued)

FOREIGN PATENT DOCUMENTS

KR 10-0743399 B1 7/2007
KR 10-0766749 B1 10/2007
(Continued)

*Primary Examiner* — Robert A Hopkins
(74) *Attorney, Agent, or Firm* — Morgan, Lewis & Bockius LLP

(57) ABSTRACT

A gas treatment system includes a first scrubber, a regenerative catalytic oxidizer (RCO) that treats gas that passes through the first scrubber, a second scrubber that treats the gas that passed through the regenerative catalytic oxidizer, and a dielectric barrier discharge (DBD) plasma reactor that treats the gas that passed through the second scrubber. The regenerative catalytic oxidizer includes a two-bed regenerative catalytic reactor.

20 Claims, 18 Drawing Sheets

(51) Int. Cl.
*B01D 53/14* (2006.01)
*B01D 53/18* (2006.01)
*B01D 53/32* (2006.01)
*B01D 53/75* (2006.01)
*B01D 53/86* (2006.01)
*F23C 13/00* (2006.01)
*F23J 15/04* (2006.01)
*F23J 15/06* (2006.01)
*F23J 15/08* (2006.01)
*H05H 1/24* (2006.01)

(56) References Cited

U.S. PATENT DOCUMENTS

| | | | |
|---|---|---|---|
| 11,065,672 B2 | 7/2021 | Ahn et al. | |
| 2013/0280154 A1* | 10/2013 | Chung | B01D 53/685 422/162 |
| 2016/0220942 A1* | 8/2016 | Yi | B01D 53/007 |

FOREIGN PATENT DOCUMENTS

| | | |
|---|---|---|
| KR | 10-0986676 B1 | 10/2010 |
| KR | 10-1102230 B1 | 1/2012 |
| KR | 10-1406198 B1 | 6/2014 |
| KR | 10-1521389 B1 | 5/2015 |
| KR | 10-1553178 | 10/2015 |
| KR | 10-1774710 B1 | 9/2017 |
| KR | 10-1825825 B1 | 2/2018 |
| KR | 10-1939609 B1 | 1/2019 |
| KR | 10-2179440 B1 | 11/2020 |
| KR | 10-2021-0127659 A | 10/2021 |
| KR | 10-20210136249 | 11/2021 |

* cited by examiner

GAS TREATMENT SYSTEM AND GAS TREATMENT METHOD USING THE SAME

CROSS-REFERENCE TO RELATED APPLICATIONS

This U.S. nonprovisional application claims priority under 35 U.S.C § 119 from Korean Patent Applications No. 10-2022-0025547, filed on Feb. 25, 2022, and No. 10-2022-0056238, filed on May 6, 2022 in the Korean Intellectual Property Office, the contents of both which are herein incorporated by reference in their entireties.

TECHNICAL FIELD

Embodiments of the present inventive concepts are directed to a gas treatment system and a gas treatment method that uses the same, and more particularly, to a gas treatment system that can reduce cost and increase efficiency and a gas treatment method that uses the same.

DISCUSSION OF THE RELATED ART

A semiconductor device is fabricated by a series of processes. For example, a semiconductor device is manufactured by a photolithography process, an etching process, and a deposition process on a wafer. Such processes use various chemical substances. The chemical substances are exhausted in gaseous state. The chemical substances should be properly treated before being exhausted from semiconductor process equipment to the atmosphere. A scrubber and a catalytic reactor can be used to treat the chemical substances.

SUMMARY

Some embodiments of the present inventive concepts provide a gas treatment system that can reduce costs and a gas treatment method that uses the same.

Some embodiments of the present inventive concepts provide a gas treatment system that can increase a lifespan of equipment and a gas treatment method that uses the same.

Some embodiments of the present inventive concepts provide a gas treatment system that can increase a maintenance period and a gas treatment method that uses the same.

According to some embodiments of the present inventive concepts, a gas treatment system includes: a first scrubber; a regenerative catalytic oxidizer (RCO) that treats a gas received from the first scrubber; a second scrubber that treats the gas received from the regenerative catalytic oxidizer; and a dielectric barrier discharge (DBD) plasma reactor that treats the gas received from the second scrubber. The regenerative catalytic oxidizer includes a two-bed regenerative catalytic reactor.

According to some embodiments of the present inventive concepts, a gas treatment system includes: a first scrubber; a regenerative catalytic oxidizer (RCO) connected to the first scrubber; and a second scrubber connected to the regenerative catalytic oxidizer. The regenerative catalytic oxidizer includes a rotary regenerative catalytic reactor.

According to some embodiments of the present inventive concepts, a gas treatment system includes: a first scrubber that treats a gas discharged from a semiconductor process chamber; a regenerative catalytic oxidizer connected to the first scrubber, where the regenerative catalytic oxidizer decomposes a fluorinated compound (FC) in the gas received from the first scrubber; a second scrubber connected to the regenerative catalytic oxidizer, where the second scrubber treats the gas received from the regenerative catalytic oxidizer; and a dielectric barrier discharge (DBD) plasma reactor connected to the second scrubber.

According to some embodiments of the present inventive concepts, a gas treatment method includes: treating a gas discharged from a semiconductor process chamber using a first scrubber; treating the gas that passed through the first scrubber with a regenerative catalytic oxidizer (RCO); treating the gas that passed through the regenerative catalytic oxidizer with a second scrubber; and treating the gas that passes through second scrubber with a dielectric barrier discharge (DBD) plasma reactor.

Details of other embodiments are included in the description and drawings.

DETAILED DESCRIPTION

Figure 1:
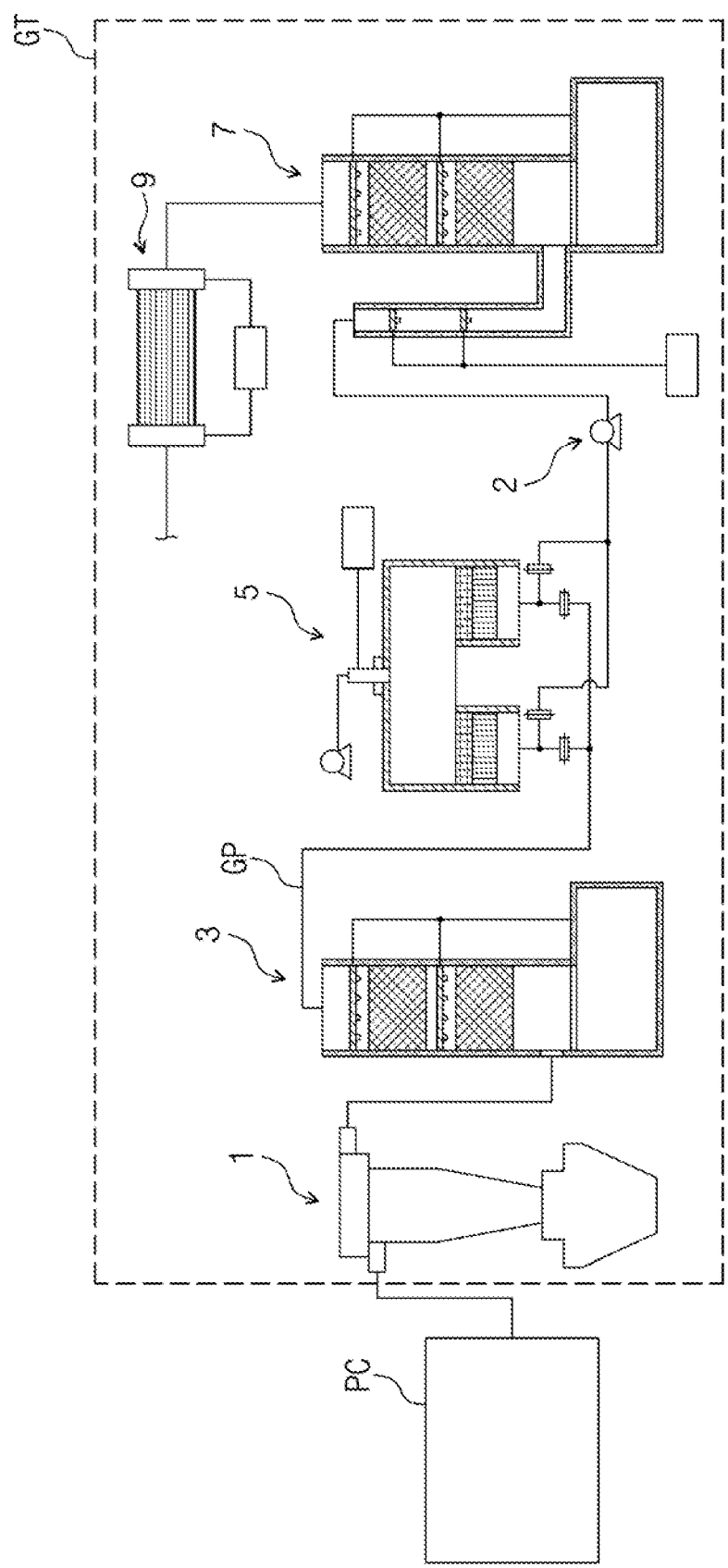
FIG. 1 illustrates a gas treatment system according to some embodiments of the present inventive concepts.

The following will now describe some embodiments of the present inventive concepts with reference to the accompanying drawings. Like reference numerals may indicate like components throughout the description.

FIG. 1 illustrates a gas treatment system according to some embodiments of the present inventive concepts.

Referring to FIG. 1, in some embodiments, a gas treatment system GT is provided. The gas treatment system GT eliminates hazardous substances from a gas. For example, the gas treatment system GT eliminates the hazardous substances in a gas exhausted from a semiconductor process chamber PC. The gas treatment system GT is connected to the semiconductor process chamber PC. The semiconductor process chamber PC performs a process on a substrate or wafer. For example, the semiconductor process chamber PC is where a substrate undergoes one or more of an etching process, a deposition process, an exposure process, a coating process, or a cleaning process.

Various chemical substances are used in the semiconductor process chamber PC. Therefore, diverse chemical substances are included in the gas exhausted from the semiconductor process chamber PC. For example, a fluorinated compound (FC) is included in the gas exhausted from the semiconductor process chamber PC. For example, the gas exhausted from the semiconductor process chamber PC includes a perfluorinated compound (PFC), such as one or more of $SF_6$, $CF_4$, or $C_2F_6$. Embodiments of the present inventive concepts, however, are not necessarily limited thereto, and the gas exhausted from the semiconductor process chamber PC may include different kinds of fluorinated compound (FC).

The gas treatment system GT decomposes the fluorinated compound (FC) in the gas exhausted from the semiconductor process chamber PC. Embodiments of the present inventive concepts, however, are not necessarily limited thereto, and in some embodiments, the gas treatment system GT is used to treat different substances in the gas. The gas treatment system GT includes a cyclone 1, a first scrubber 3, a regenerative catalytic oxidizer (RCO) 5, a second scrubber 7, and a dielectric barrier discharge (DBD) plasma reactor 9. The cyclone 1, the first scrubber 3, the regenerative catalytic oxidizer 5, the second scrubber 7, and the DBD plasma reactor 9 are connected to each other through a gas pipe GP. The gas exhausted from the semiconductor process chamber PC is treated while sequentially passing through the cyclone 1, the first scrubber 3, the regenerative catalytic oxidizer 5, the second scrubber 7, and the DBD plasma reactor 9. A detailed description thereof will be further provided below.

An intermediate blower 2 is positioned on the gas pipe GP. The intermediate blower 2 accelerate the flow of the gas in the gas pipe GP. The intermediate blower 2 is positioned between the regenerative catalytic oxidizer 5 and the second scrubber 7. For example, the intermediate blower 2 forces the gas received from the regenerative catalytic oxidizer 5 to accelerate toward the second scrubber 7. A detailed description thereof will be further provided below.

Figure 2:
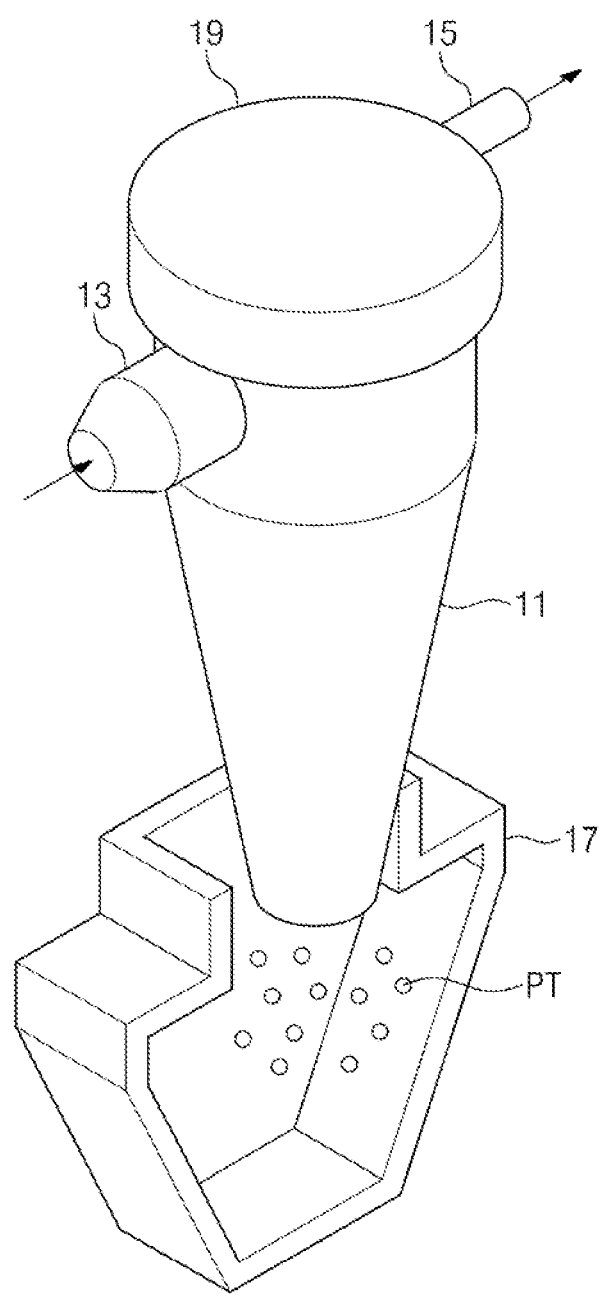
FIG. 2 is a perspective view of a cyclone according to some embodiments of the present inventive concepts.

FIG. 2 is a perspective view of a cyclone according to some embodiments of the present inventive concepts.

Referring to FIG. 2, in some embodiments, the cyclone 1 is connected to the semiconductor process chamber PC of FIG. 1. The gas exhausted from the semiconductor process chamber PC is introduced into the cyclone 1. The cyclone 1 separates particles PT in the gas. For example, the particles PT are separated from the gas that passes through the cyclone 1. The cyclone 1 includes a cyclone body 11, a first gas inlet port 13, a first gas outlet port 15, a particle collector 17, and a fan 19.

The gas is introduced through the first gas inlet port 13 into the cyclone body 11. The fan 19 is driven by a motor. A rotation of the fan 19 rotates the gas in the cyclone body 11. When the gas rotates in the cyclone body 11, the particles PT in the gas separate by centrifugal force. The particles PT separated from the gas fall down to the particle collector 17. The gas from which the particles PT are separated is discharged through the first gas outlet port 15.

Although the cyclone 1 forces the separation of particles PT from the gas, embodiments of the present inventive concepts are not necessarily limited thereto. For example, in some embodiments, when the gas has a small amount of the particles PT therein, the step of using the cyclone 1 to separate the particle PT may be omitted.

Figure 3:
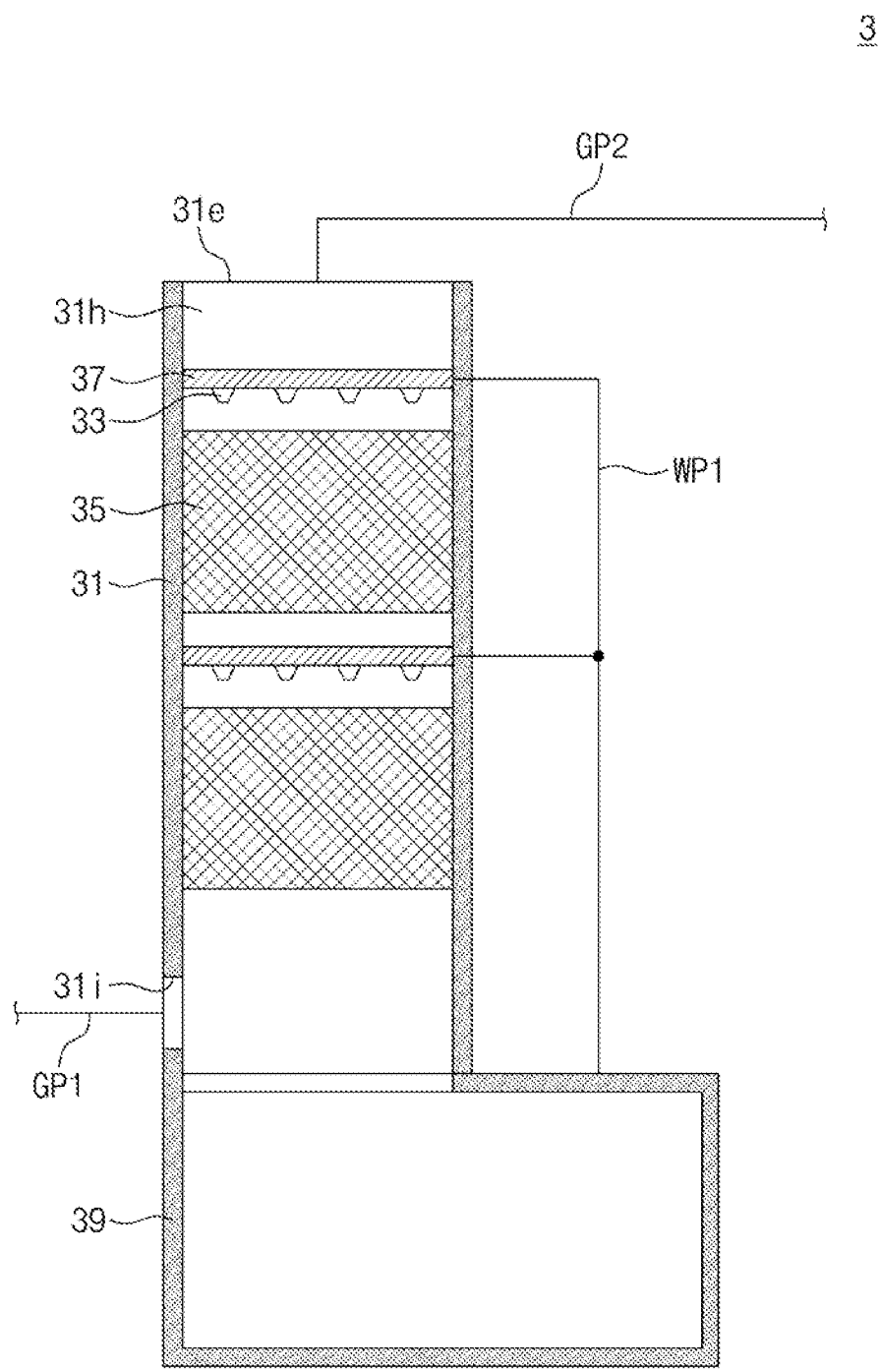
FIG. 3 is a cross-sectional view of a first scrubber according to some embodiments of the present inventive concepts.

FIG. 3 is a cross-sectional view of a first scrubber according to some embodiments of the present inventive concepts.

Referring to FIG. 3, in some embodiments, the first scrubber 3 eliminates a specific constituent in the gas. The first scrubber 3 includes a first cleaning housing 31, a first cleaning nozzle 33, a first packing member 35, a first nozzle support member 37, and a first cleaning water tank 39.

The first cleaning housing 31 provides a first cleaning space 31$h$ that extends vertically. The first cleaning space 31$h$ is connected through a first cleaning inlet port 31$i$ to a first gas pipe GP1. In addition, the first cleaning space 31$h$ is connected through a first cleaning outlet port 31$e$ to a second gas pipe GP2. The gas in the first gas pipe GP1 is introduced through the first cleaning inlet port 31$i$ into the first cleaning housing 31. The gas upwardly ascends along the first cleaning housing 31. The gas is discharged through the first cleaning outlet port 31$e$ to the second gas pipe GP2.

The first cleaning nozzle 33 is positioned in the first cleaning housing 31. The cleaning nozzle 33 provides cleaning water to the first packing member 35. For example, the first cleaning nozzle 33 sprays the cleaning water into the gas that passes through the first packing member 35. The cleaning water sprayed from the first cleaning nozzle 33 eliminates a specific constituent in the gas that passes through the first cleaning housing 31. For example, the cleaning water eliminates one or more of HF, HCl, or $F_2$ in the gas. The cleaning water is one or more of water ($H_2O$) and/or a NaOH aqueous solution. A detailed description thereof will be further provided below. A plurality of first cleaning nozzles 33 may be provided. In this description below, a single first cleaning nozzle 33 will be discussed in the interest of convenience.

The first packing member 35 is positioned in the first cleaning housing 31. The first packing member 35 is located below the first cleaning nozzle 33. The first packing member 35 provides a path through which a fluid flows. For example, the first packing member 35 provides various flow paths to increase a contact area between the cleaning water and a substance in the gas. Flow paths of one or more of the gas and/or the cleaning water are curved through the first packing member 35. A contact between the gas and the cleaning water is increased due to the first packing member 35.

The first nozzle support member 37 supports the first cleaning nozzle 33. The first nozzle support member 37 provides the first cleaning nozzle 33 with the cleaning water.

The first cleaning water tank 39 is positioned below the first cleaning housing 31. The first cleaning water tank 39 collects the cleaning water sprayed from the first cleaning nozzle 33. The cleaning water collected in the first cleaning water tank 39 is supplied again to the first cleaning nozzle 33 through a first water pipe WP1.

Figure 4:
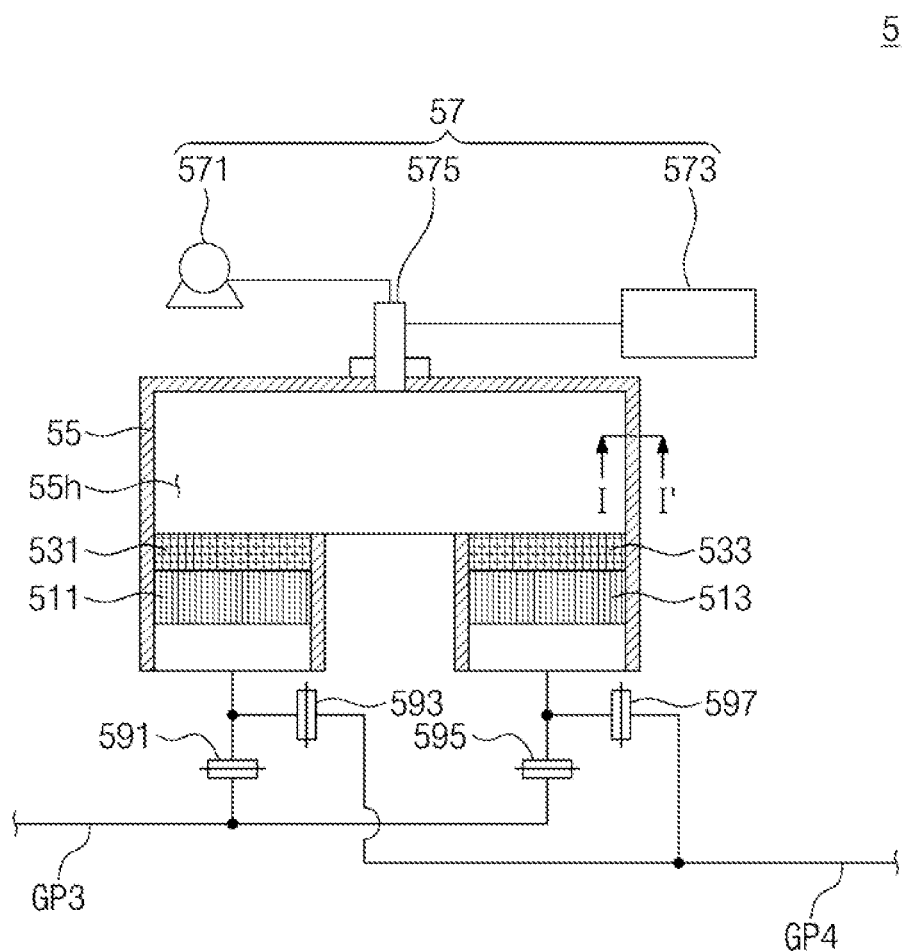
FIG. 4 is a cross-sectional view of a regenerative catalytic oxidizer according to some embodiments of the present inventive concepts.

FIG. 4 is a cross-sectional view of a regenerative catalytic oxidizer according to some embodiments of the present inventive concepts.

Referring to FIG. 4, in some embodiments, a regenerative catalytic oxidizer 5 includes a two-bed regenerative catalytic reactor. The regenerative catalytic oxidizer 5 decomposes a specific constituent in the gas. For example, the regenerative catalytic oxidizer 5 decomposes the fluorinated compounds (FC) in the gas. The gas is introduced through a third gas pipe GP3 into the regenerative catalytic oxidizer 5. In addition, the gas is exhausted through a fourth gas pipe GP4 from the regenerative catalytic oxidizer 5. The regenerative catalytic oxidizer 5 includes a first heat storage medium 511, a first catalytic layer 531, a second heat storage medium 513, a second catalytic layer 533, a combustion chamber 55, a combustion apparatus 57, a first damper 591, a second damper 593, a third damper 595, and a fourth damper 597.

The first heat storage medium 511 stores and/or discharges heat. For example, the first heat storage medium 511 temporarily stores heat. When the gas that passes through the first heat storage medium 511 has a temperature less than that of the first heat storage medium 511, the first heat storage medium 511 discharges heat into the gas. When the gas that passes through the first heat storage medium 511 has a temperature greater than that of the first heat storage medium 511, the gas discharges heat into the first heat storage medium 511. The first heat storage medium 511 has a porous structure. For example, the first heat storage medium 511 has a honeycomb structure, but embodiments of the present inventive concepts are not necessarily limited thereto. The first heat storage medium 511 includes an excellent refractory material. For example, the first heat storage medium 511 includes a ceramic.

The first catalytic layer 531 is positioned on the first heat storage medium 511. The first catalytic layer 531 includes a catalyst for a decomposition reaction of the fluorinated compounds (FC) in the gas. For example, the first catalytic layer 531 includes Co or $ZrO_2$—$Al_2O_3$, but embodiments of the present inventive concepts are not necessarily limited thereto.

The second heat storage medium 513 is spaced apart in a horizontal direction from the first heat storage medium 511. The combustion chamber 55 is positioned above and between the second heat storage medium 513 and the first heat storage medium 511. The second heat storage medium 513 includes a material and a configuration that are substantially the same as those of the first heat storage medium 511.

The second catalytic layer 533 is positioned on the second heat storage medium 513. The second catalytic layer 533 is spaced apart in a horizontal direction from the first catalytic layer 531. The second catalytic layer 533 includes a material and a configuration that are substantially the same as those of the first catalytic layer 531.

The combustion chamber 55 provides a combustion space 55h. The combustion space 55h is positioned above and between the first catalytic layer 531 and the second catalytic layer 533. Therefore, the gas that has passed through the first catalytic layer 531 flows through the combustion space 55h to the second catalytic layer 533. A combustion reaction is performed in the combustion chamber 55. The combustion chamber 55 will be further discussed in detail below.

The combustion apparatus 57 includes a combustion air blower 571, a fuel supply device 573, and a burner 575. The combustion air blower 571 provides air for combustion. The fuel supply device 573 provides a fuel for combustion. For example, the fuel supply device 573 provides one or more of a liquefied natural gas (LNG), a hydrocarbon combustion gas, or a hydrocarbon alternative combustion gas. The burner 575 uses air and fuel to induce a combustion reaction. The burner 575 is a plasma-fuel hybrid burner. For example, fuel consumption is reduced. The burner 575 causes a combustion reaction in the combustion chamber 55. Thus, the gas that passes through the combustion chamber 55 is heated to a high temperature. Although the burner 575 is described as being used for the fuel combustion, embodiments of the present inventive concepts are not necessarily limited thereto. For example, in an embodiment, an electric heat source is used to burn fuel.

The first damper 591 is positioned between the first heat storage medium 511 and the third gas pipe GP3. The second damper 593 is positioned between the first heat storage medium 511 and the fourth gas pipe GP4. The third damper 595 is positioned between the second heat storage medium 513 and the third gas pipe GP3. The fourth damper 597 is positioned between the second heat storage medium 513 and the fourth gas pipe GP4. A detailed description of functions thereof will be provided below.

Figure 5:
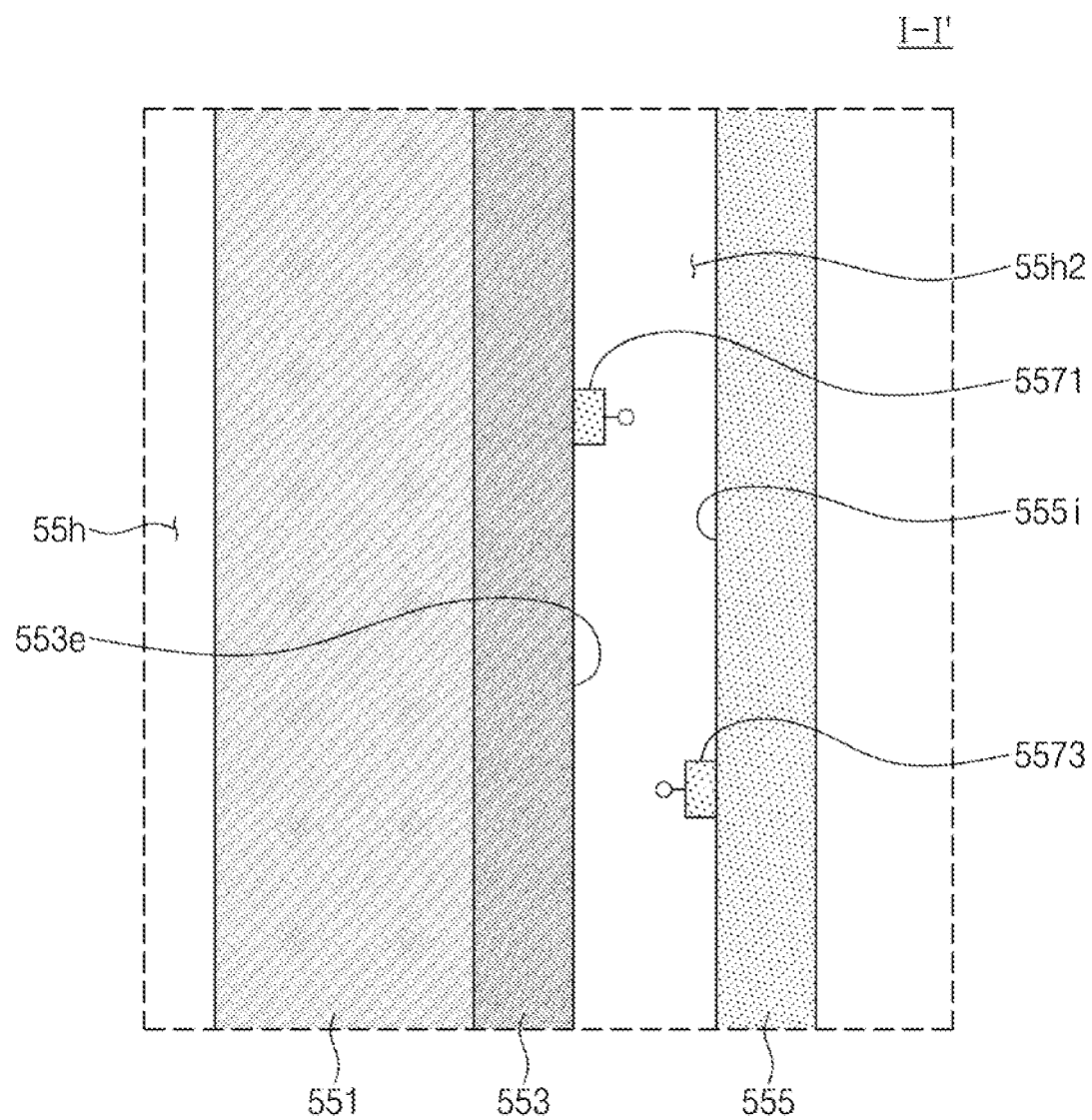
FIG. 5 is a cross-sectional view taken along line I-I' of FIG. 4.

FIG. 5 is a cross-sectional view taken along line I-I' of FIG. 4.

Referring to FIGS. 4 and 5, in some embodiments, the combustion chamber 55 includes an inner wall 551, a steel layer 553, an outer adiabatic layer 555, a first temperature sensor 5571, a second temperature sensor 5573, and a pressure sensor.

The inner wall 551 surrounds the combustion space 55h. The inner wall 551 prevents corrosion of the steel layer 553. The inner wall 551 includes one or more of a castable refractory and a brick.

The steel layer 553 is coupled to an outer side of the inner wall 551. The steel layer 553 surrounds the inner wall 551. The steel layer 553 includes one of carbon steel or stainless steel. For example, the steel layer 553 includes 304-series stainless steel. The steel layer 553 has a thickness that depends on a thickness of the inner wall 551 and on a thickness, a temperature condition and/or a pressure condition of the outer adiabatic layer 555. To achieve corrosion resistance, the inner wall 551 has a clearance of about 3 mm in thickness.

The outer adiabatic layer 555 is positioned outside the steel layer 553. The outer adiabatic layer 555 surrounds the steel layer 553. The outer adiabatic layer 555 outwardly spaced apart from the steel layer 553. Therefore, an adiabatic space 55h2 is formed between an inner surface 555i of the outer adiabatic layer 555 and an outer surface 553e of the steel layer 553.

The first temperature sensor 5571 is coupled to the steel layer 553. The first temperature sensor 5571 detects a temperature of a surface of the steel layer 553. When the first temperature sensor 5571 detects that the temperature of the steel layer 553 has increased to a first predetermined value or higher, an abnormal signal occurs.

The second temperature sensor 5573 is positioned in the adiabatic space 55h2. The second temperature sensor 5573 detects a temperature of the adiabatic space 55h2. When the second temperature sensor 5573 detects that the temperature of the adiabatic space 55h2 has increased to a second predetermined value or higher, an abnormal signal occurs. In an embodiment, the first predetermined value is the same as the second predetermined value. The pressure sensor is positioned in the adiabatic space 55h2. The pressure sensor detects a pressure of the adiabatic space 55h2. When the pressure of the adiabatic space 55h2 deviates from a normal range, an abnormal signal occurs.

Figure 6:
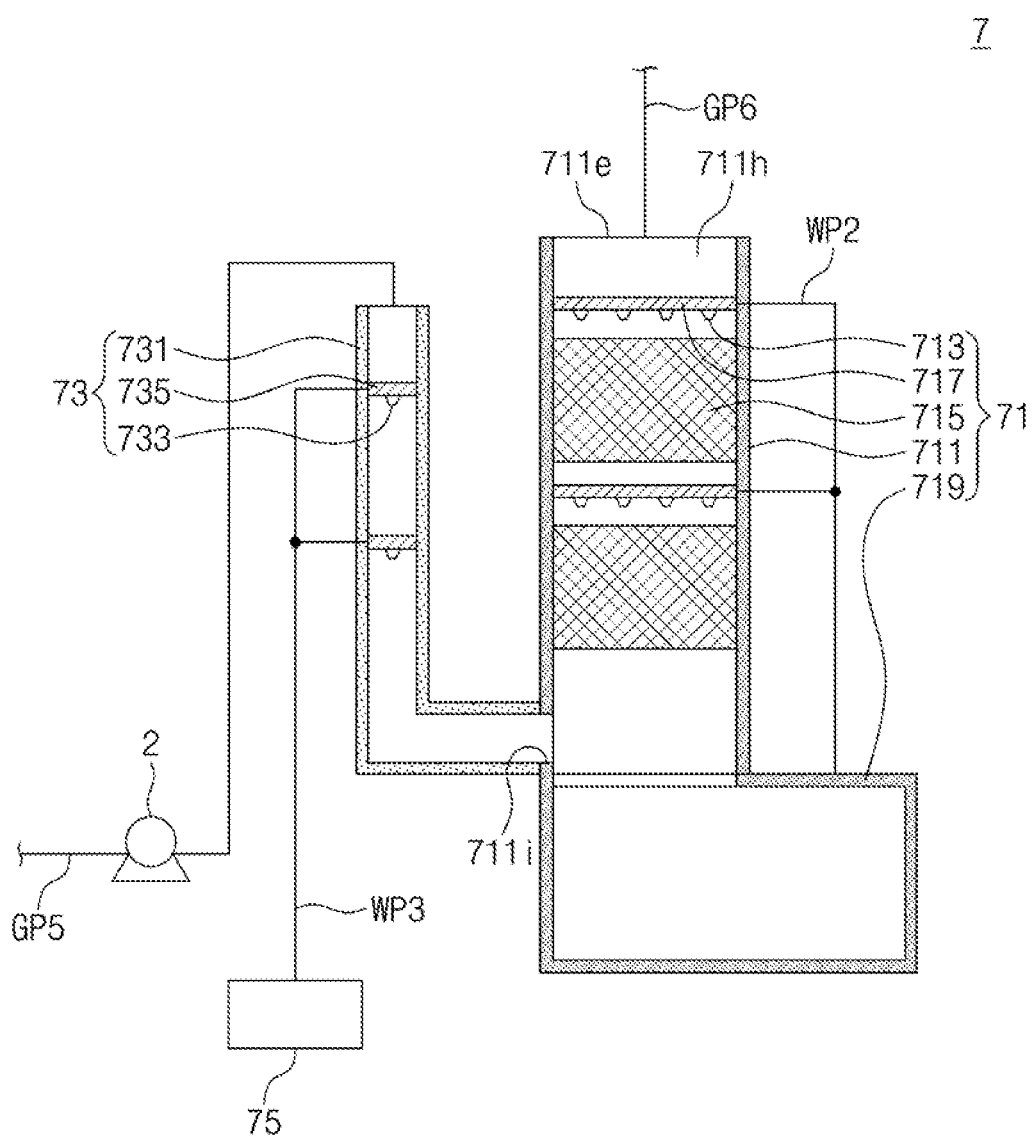
FIG. 6 is a cross-sectional view of a second scrubber according to some embodiments of the present inventive concepts.

FIG. 6 is a cross-sectional view of a second scrubber according to some embodiments of the present inventive concepts.

Referring to FIG. 6, in some embodiments, the gas accelerated by the intermediate blower 2 is introduced through a fifth gas pipe GP5 into the second scrubber 7. The gas treated in the second scrubber 7 is discharged from the second scrubber 7 through a second cleaning outlet port 711e to a sixth gas pipe GP6. The second scrubber 7 cools and/or treats the gas. The second scrubber 7 includes a cleaning section 71, a cooling section 73, and a cooling water supply apparatus 75.

The cleaning section 71 treats the gas. The cleaning section 71 includes a second cleaning housing 711, a second cleaning nozzle 713, a second packing member 715, a second nozzle support member 717, a second cleaning water tank 719, and a second water pipe WP2. The second cleaning housing 711, the second cleaning nozzle 713, the second packing member 715, the second nozzle support member 717, the second cleaning water tank 719 and the second water pipe WP2 respectively correspond to and are substantially the same as or similar to the first cleaning housing 31, the first cleaning nozzle 33, the first packing member 35, the first nozzle support member 37, the first cleaning water tank 39 and the first water pipe WP1 that are described with reference to FIG. 3, and a repeated description thereof is omitted.

The cooling section 73 cools the gas. The cooling section 73 is positioned between the cleaning section 71 and the regenerative catalytic oxidizer 5 of FIG. 4. The cooling section 73 cools the gas that has passed through the regenerative catalytic oxidizer 5. The cooling section 73 includes a cooling housing 731, a cooling nozzle 733, and a cooling nozzle support member 735. The cooling housing 731 extends vertically. The cooling housing 731 is connected to a cleaning inlet port 711$i$ of the cleaning section 71. For example, a lower portion of the cooling housing 731 is coupled to a lower portion of the second cleaning housing 711. Therefore, a cooling space in the cooling housing 731 is connected to a second cleaning space 711$h$ provide by the second cleaning housing 711. The cooling nozzle 733 sprays cooling water into the cooling housing 731. Therefore, the gas that passes through the cooling housing 731 is reduced in temperature. The cooling nozzle support member 735 supports the cooling nozzle 733. The cooling water supply apparatus 75 provides the cooling nozzle 733 with the cooling water through a third water pipe WP3.

In addition, the cooling section 73 eliminates impurities in the gas. For example, the cooling water removes a portion of the impurities in the gas that passes through the cooling section 73. Therefore, a load applied to the second cleaning housing 711 is reduced. Therefore, one or more of the second cleaning housing 711, the second cleaning nozzle 713, or the second packing member 715 has a decreased volume.

Although the cooling water is described as being supplied from the separately provided cooling water supply apparatus 75, embodiments of the present inventive concepts are not necessarily limited thereto. For example, in some embodiments, the cleaning water in the second cleaning water tank 719 is used as cooling water in the cooling section 73. For example, the cooling water supply apparatus 75 is not separately provided.

Figure 7:
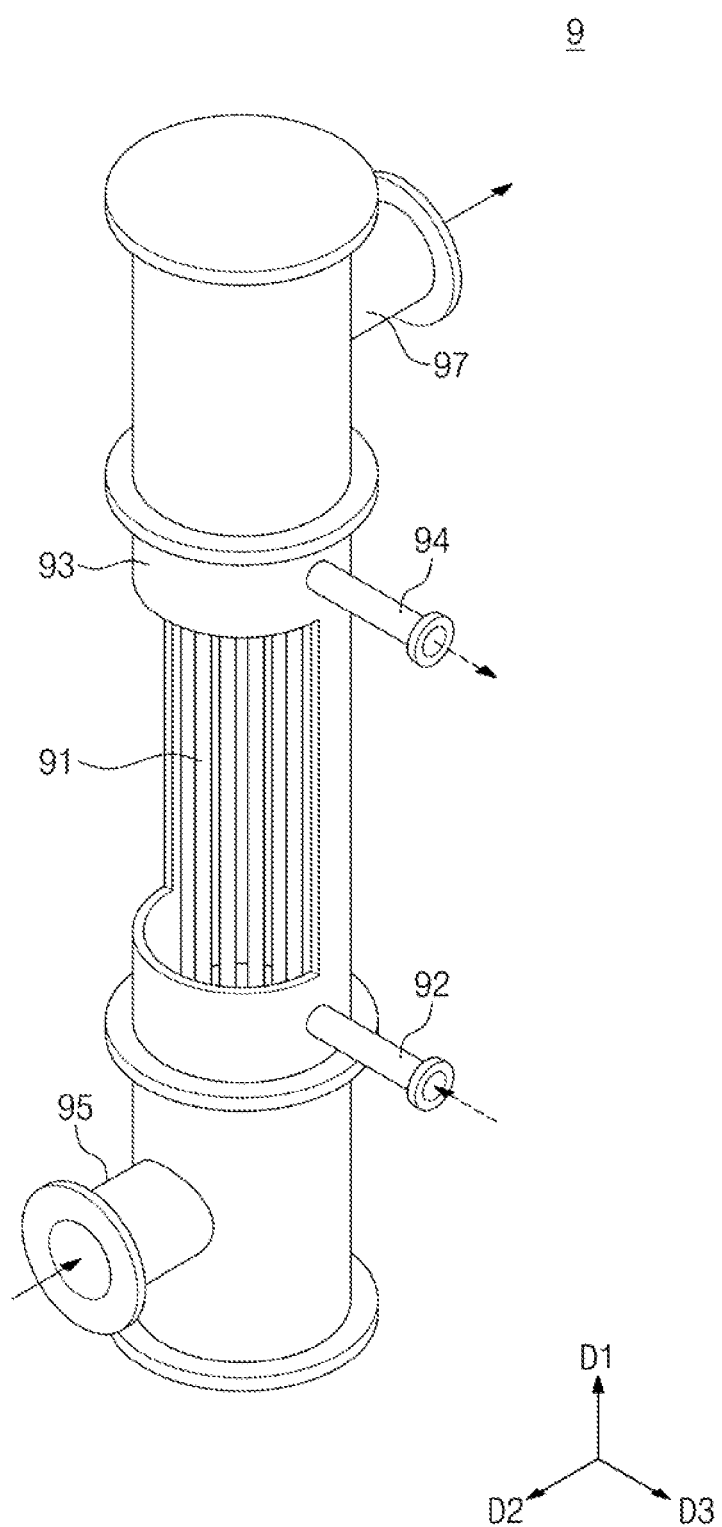
FIG. 7 is a perspective view of a DBD plasma reactor according to some embodiments of the present inventive concepts.

FIG. 7 is a perspective view of a DBD plasma reactor according to some embodiments of the present inventive concepts.

In this description, symbol D1 indicates a first direction, symbol D2 indicates a second direction that intersects the first direction D1, and symbol D3 indicates a third direction that intersects each of the first and second directions D1 and D2.

Referring to FIG. 7, in some embodiments, the DBD plasma reactor 9 decomposes a specific constituent in the gas. For example, the DBD plasma reactor 9 decomposes the fluorinated compounds (FC) in the gas. The DBD plasma reactor 9 includes a plasma generator 91, a plasma reaction housing 93, a second gas inlet port 95, a second gas outlet port 97, a cooling water inlet port 92, and a cooling water outlet port 94.

The plasma generator 91 extends in the first direction D1. The plasma generator 91 generates plasma therein. The fluorinated compounds (FC) are decomposed while the gas passes through the plasma generator 91. A plurality of the plasma generators 91 may be provided. The plurality of plasma generators 91 are spaced apart from each other in the second direction D2 and/or the third direction D3. For convenience, the following will describe a single plasma generator 91. The plasma generator 91 will be further discussed in detail below.

The plasma reaction housing 93 surrounds the plasma generator 91.

The second gas inlet port 95 is connected to one end of the plasma generator 91. The gas is introduced through the second gas inlet port 95 into the plasma generator 91.

The second gas outlet port 97 is connected to another end of the plasma generator 91. The gas is discharged from the plasma generator 91 through the second gas outlet port 97.

The cooling water inlet port 92 is connected to the plasma generator 91. Cooling water is introduced through the cooling water inlet port 92 into the plasma generator 91.

The cooling water outlet port 94 is connected to the plasma generator 91. The cooling water is discharged from the plasma generator 91 through the cooling water outlet port 94.

Although the plasma generator 91 is described as being cooled by the cooling water, embodiments of the present inventive concepts are not necessarily limited thereto. In some embodiments, air is used to cool the plasma generator 91. The plasma generator 91 is then an air-cooled type plasma generator.

Figure 8:
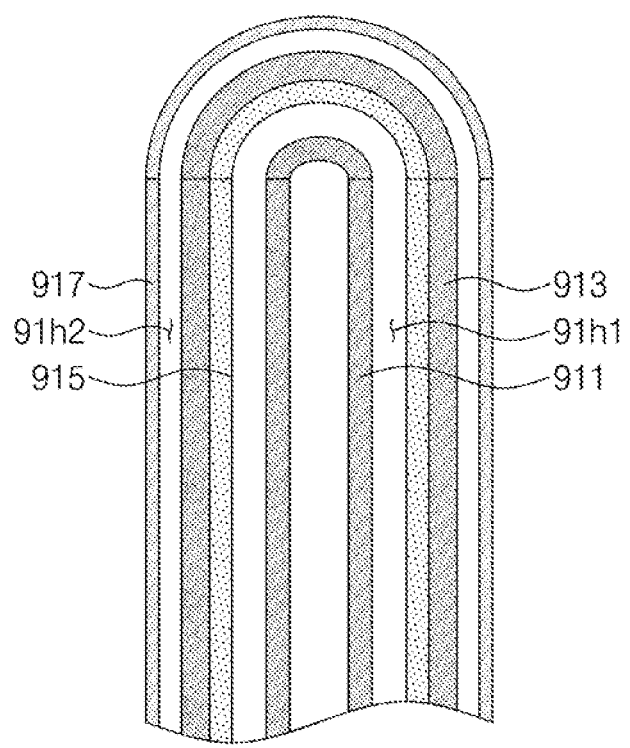
FIG. 8 is a perspective view that partially shows a DBD plasma reactor according to some embodiments of the present inventive concepts.
Figure 8:
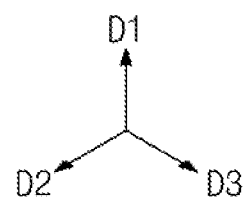

FIG. 8 is a perspective view of a plasma generator 91 according to some embodiments of the present inventive concepts.

Referring to FIG. 8, in some embodiments, the plasma generator 91 includes an inner electrode 911, an outer electrode 913, a dielectric layer 915, and a cooling pipe 917.

The inner electrode 911 extends in the first direction D1. The inner electrode 911 may include steel, but embodiments of the present inventive concepts are not necessarily limited thereto.

The outer electrodes 913 extends in the first direction D1. The outer electrode 913 surrounds the inner electrode 911. The outer electrode 913 may include steel, but embodiments of the present inventive concepts are not necessarily limited thereto. An inner surface of the outer electrode 913 is outwardly spaced apart from an outer surface of the inner electrode 911. Therefore, a gas treatment path 91$h$1 is formed between the inner electrode 911 and the outer electrode 913. The gas treatment path 91$h$1 is connected to the sixth gas pipe GP6 of FIG. 6 through the second gas inlet port 95 of FIG. 7 and to the second gas outlet port 97 of FIG. 7. Thus, the gas treatment path 91$h$1 is connected to an internal space of the second scrubber 7 of FIG. 6.

The dielectric layer 915 extends in the first direction D1. The dielectric layer 915 is positioned between the inner electrode 911 and the outer electrode 913. For example, the dielectric layer 915 is coupled to the outer electrode 913. The dielectric layer 915 includes one or more of ceramic or quartz, but embodiments of the present inventive concepts are not necessarily limited thereto.

The cooling pipe 917 extends in the first direction D1. The cooling pipe 917 surrounds the outer electrode 913. An inner surface of the cooling pipe 917 is spaced apart from an outer surface of the outer electrode 913. Therefore, a cooling path 91h2 is formed between the cooling pipe 917 and the outer electrode 913. One end of the cooling path 91h2 is connected to the cooling water inlet port 92 of FIG. 7. Another end of the cooling path 91h2 is connected to the cooling water outlet port 94 of FIG. 7. The cooling water flows along the cooling path 91h2. The cooling water cools the outer electrode 913. When the plasma generator 91 is an air-cooled type, the cooling path 91h2 is provided therein with air, not cooling water.

Figure 9:
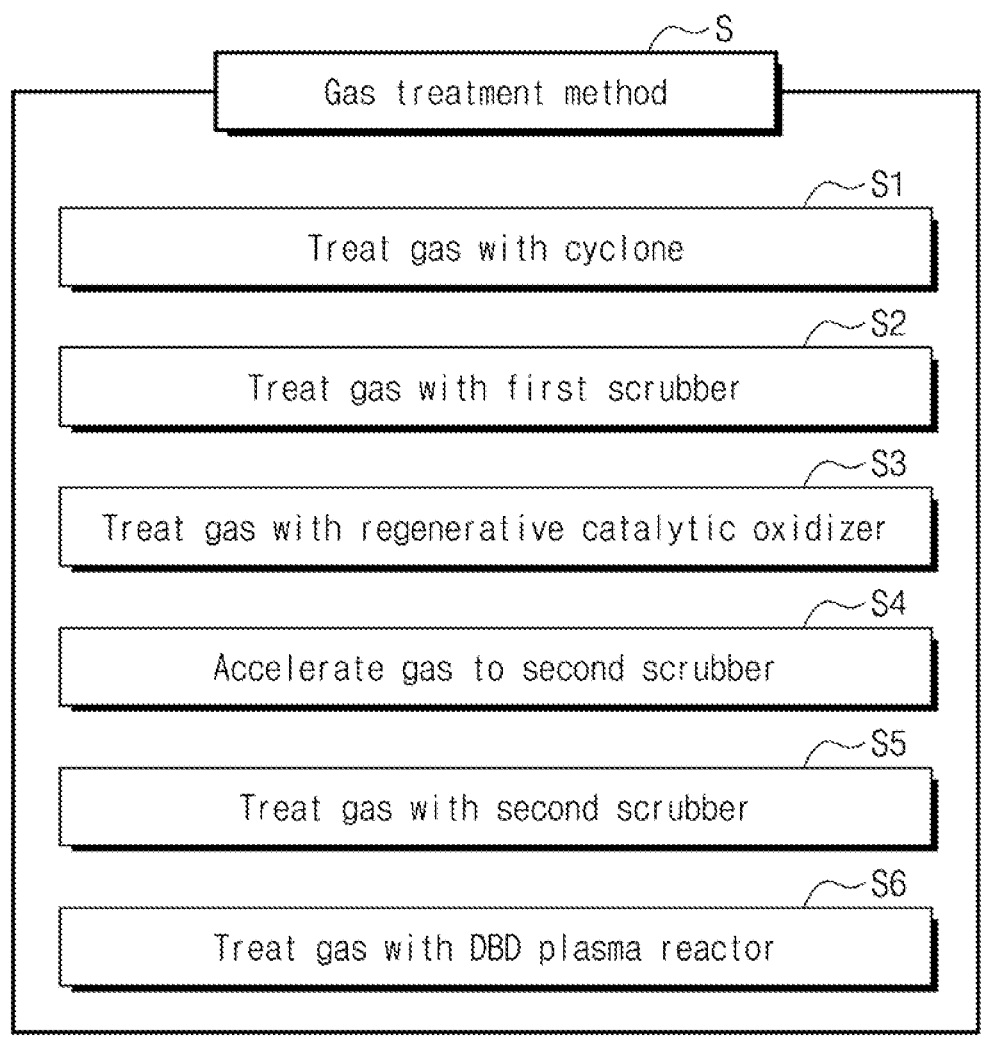
FIG. 9 is a flow chart of a gas treatment method according to some embodiments of the present inventive concepts.

FIG. 9 is a flow chart of a gas treatment method according to some embodiments of the present inventive concepts.

Referring to FIG. 9, in some embodiments, a gas treatment method S is provided. The gas treatment method S uses the gas treatment system GT of FIG. 1 described with reference to FIGS. 1 to 8. The gas treatment method S includes a step S1 of treating a gas with a cyclone, a step S2 of treating the gas with a first scrubber, a step S3 of treating the gas with a regenerative catalytic oxidizer, a step S4 of accelerating the gas that is introduced into a second scrubber, a step S5 treating the gas with the second scrubber, and a step S6 of treating the gas with a dielectric barrier discharge (DBD) plasma reactor.

The gas treatment method S of FIG. 9 will be described below in detail with reference to FIGS. 10 to 14.

FIGS. 10 to 14 illustrate a gas treatment method in accordance with the flow chart of FIG. 9.

Figure 10:
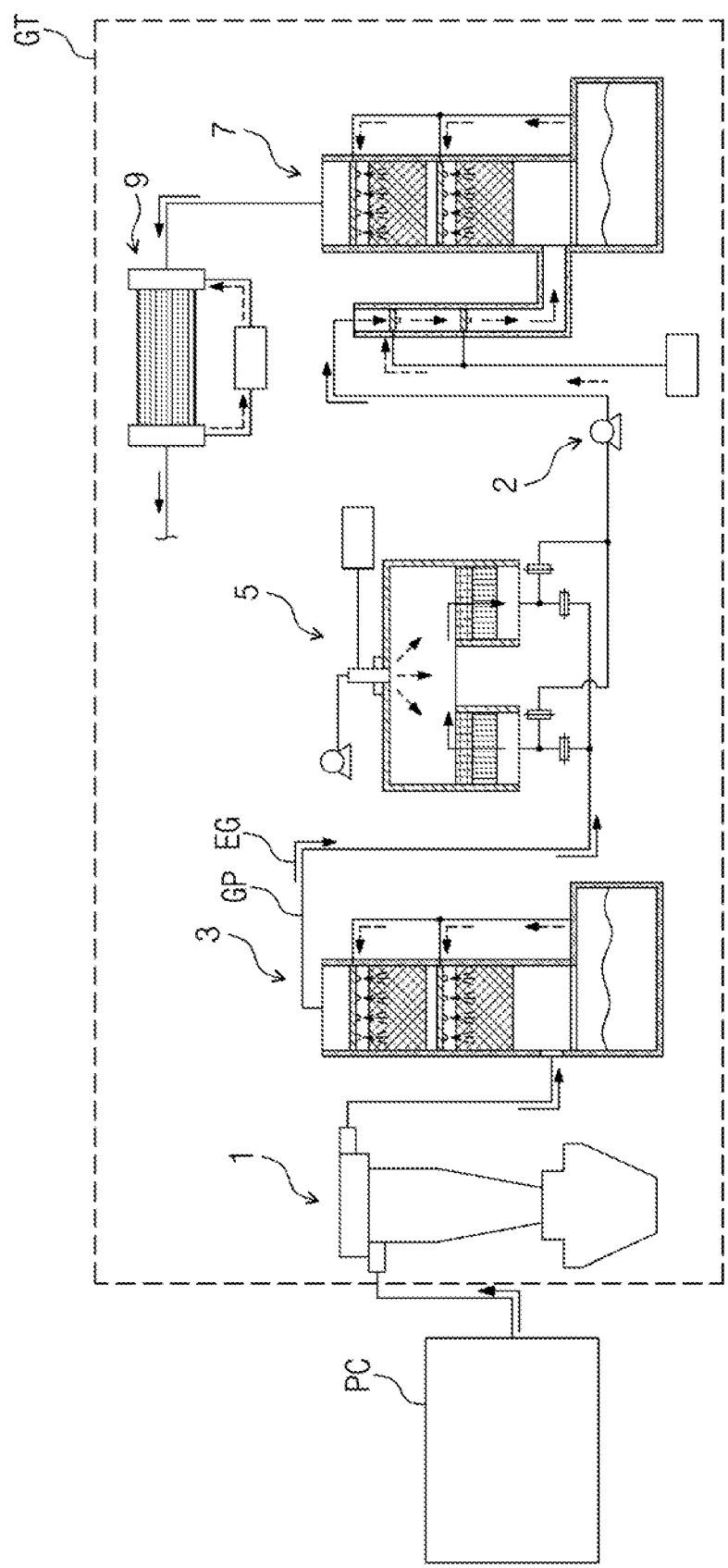
FIGS. 10 to 14 illustrate a gas treatment method in accordance with a flow chart of FIG. 9.

Referring to FIG. 10, in an embodiment, a gas EG is discharged from the semiconductor process chamber PC. The gas EG includes fluorinated compounds (FC). The gas EG is introduced through the gas pipe GP into the gas treatment system GT.

Referring to FIGS. 2, 9, and 10, in an embodiment, step S1 includes using the cyclone 1 to separate a particle PT from the gas EG. For example, when a fan 19 rotation forces the gas EG to rotate, a centrifugal force separates the particle PT from the gas EG. The first scrubber 3 receives the gas EG from which the particle PT is separated.

Referring to FIGS. 3, 9, and 10, in an embodiment, step S2 includes removing a specific constituent from the gas EG in the first scrubber 3. For example, when the gas EG passes through the first cleaning housing 31, the cleaning water sprayed from the first cleaning nozzle 33 eliminates one or more of HF, HCl, and/or $F_2$ from the gas EG. The regenerative catalytic oxidizer 5 receives the gas EG from which one or more of HF, HCl, and/or $F_2$ are removed.

Figure 11:
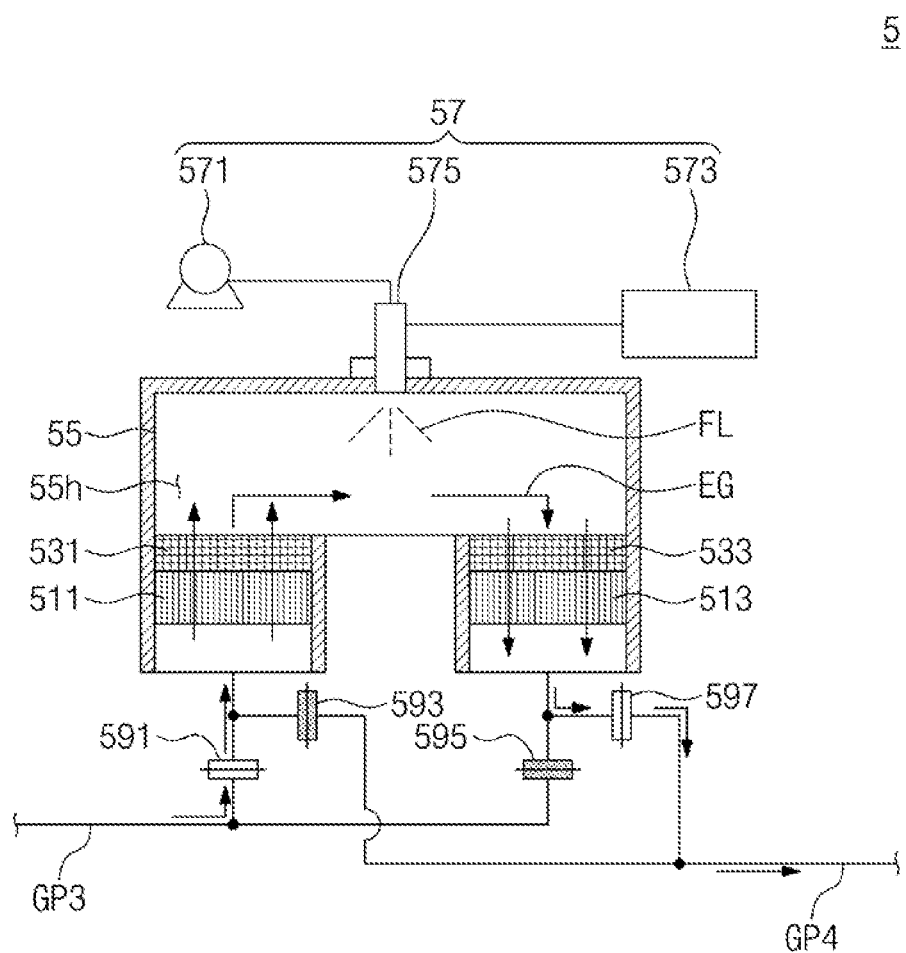

Referring to FIGS. 9 and 11, in an embodiment, step S3 includes opening the first and fourth dampers 591 and 597. Simultaneously, the second and third dampers 593 and 595 are closed. Therefore, the gas EG sequentially pass through the first heat storage medium 511, the first catalytic layer 531, the combustion space 55h, the second catalytic layer 533, and the second heat storage medium 513.

When the gas EG passes through the first heat storage medium 511, the temperature of gas EG is increased. When the gas EG with the increased temperature passes through the first catalytic layer 531, the fluorinated compounds (FC) in the gas EG are decomposed. When the gas EG passes through the combustion space 55h, a combustion flame FL further increases the temperature of the gas EG. When the gas EG passes through the second catalytic layer 533, the fluorinated compounds (FC) in the gas EG are decomposed. When the gas EG passes through the second heat storage medium 513, the temperature of the gas EG is reduced. The gas EG that has passed through the second heat storage medium 513 is discharged through the fourth gas pipe GP4.

Figure 12:
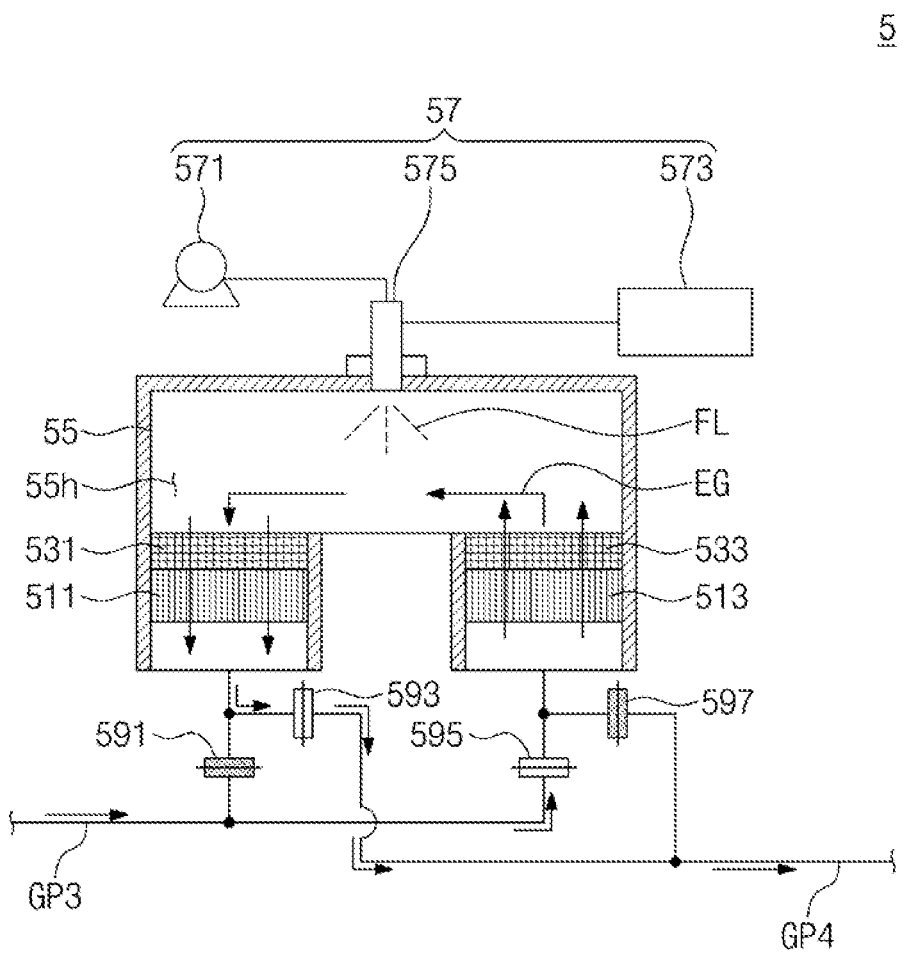

Referring to FIG. 12, in an embodiment, after a certain amount of time has elapsed, the first and fourth dampers 591 and 597 are closed. At the same time, the second and third dampers 593 and 595 are opened. Therefore, the gas EG sequentially passes through the second heat storage medium 513, the second catalytic layer 533, the combustion space 55h, the first catalytic layer 531, and the first heat storage medium 511. For example, the gas EG flows backwards.

When the gas EG sequentially passes through the second heat storage medium 513, the second catalytic layer 533, the combustion space 55h, the first catalytic layer 531, and the first heat storage medium 511, a reaction occurs that is similar to that described with reference to FIG. 11. When the gas EG passes through the first heat storage medium 511, the gas EG has a reduced temperature. The gas EG that has passed through the first heat storage medium 511 is discharged through the fourth gas pipe GP4.

The gas EG that passes through the regenerative catalytic oxidizer 5 has a temperature of about 90° C. to about 130° C. For example, the gas EG that passes through the fourth gas pipe GP4 has a temperature of about 120° C.

The process described with reference to FIG. 11 and the process described with reference to FIG. 12 are periodically and repeatedly performed. For example, the process of FIG. 11 and the process of FIG. 12 are repetitively executed at an interval of about 30 minutes. In this way, a temperature exchange is effectively carried out between the heat storage media and the gases. The fluorinated compounds (FC) are decomposed into one or more of HF and/or $F_2$ in the regenerative catalytic oxidizer 5.

Figure 13:
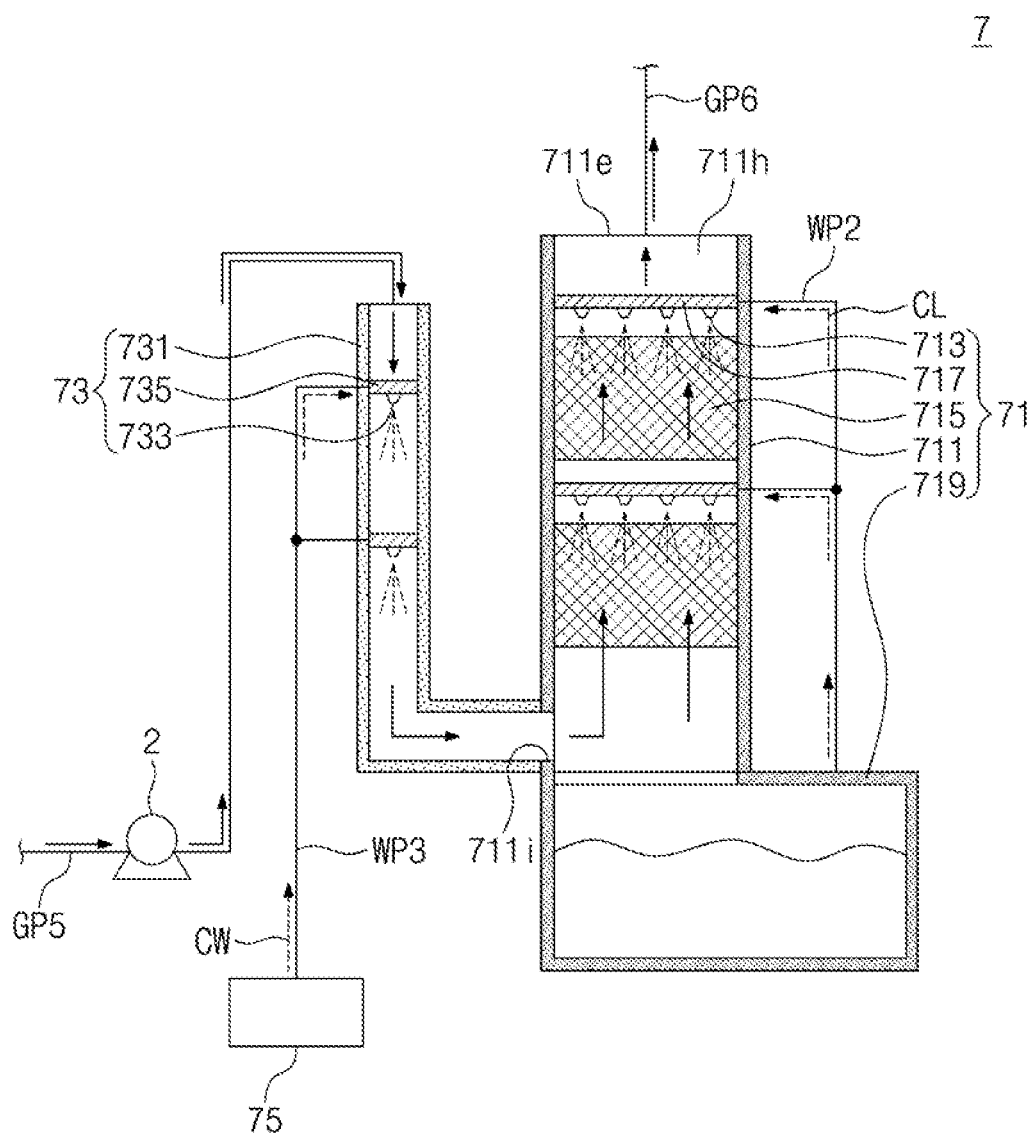

Referring to FIGS. 9 and 13, the step S4 includes using the intermediate blower 2 to accelerate the gas EG that has passed through the regenerative catalytic oxidizer 5 of FIG. 12. The accelerated gas EG is introduced into the second scrubber 7.

Step S5 includes using the cooling section 73 to spray cooling water CW to cool the gas EG. The gas EG is cooled by the cooling water CW while passing through the cooling housing 731. For example, the gas EG has a temperature of about 90° C. to about 130° C. after passing through the regenerative catalytic oxidizer 5 of FIG. 12, and the cooling water CW cools the gas EG to a temperature of between about 40° C. to about 70° C. Within a range of about 40° C. to about 70° C., the cooling section 71 is prevented from being damaged. In addition, the cooling water CW also eliminates impurities in the gas EG. Therefore, a load applied to the second cleaning housing 711 is reduced.

The step S5 further includes using the cleaning section 71 to spray a cleaning water CL to treat the gas EG. For example, the cleaning water CL sprayed from the second cleaning nozzle 713 eliminates one or more of HF, HCl, and/or $F_2$ in the gas EG. The gas EG that has passed through the cleaning section 71 is discharged through the sixth gas pipe GP6.

Figure 14:
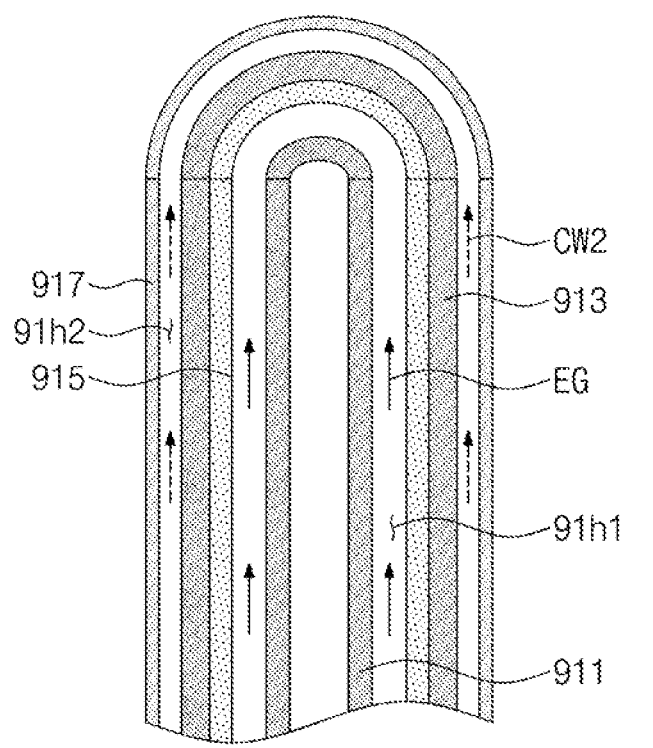
Figure 14:
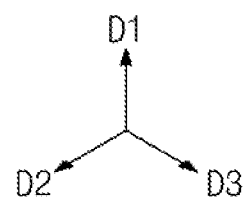

Referring to FIGS. 9 and 14, step S6 includes flowing the gas EG through the gas treatment path 91h1. In this step, the inner and outer electrodes 911 and 913 generate plasma. The plasma decomposes the fluorinated compounds (FC) in the gas EG. For example, cooling water CW2 flows through the cooling path 91h2. The cooling water CW2 cools the plasma generator 91. Alternatively, when the plasma generator 91 is an air-cooled type of plasma generator, air flows through the cooling path 91h2. The plasma generator 91 is cooled by the air that flows through the cooling path 91h2.

Referring back to FIG. 10, in an embodiment, the gas EG that has passed through the DBD plasma reactor 9 is discharged into the atmosphere.

According to a gas treatment system and a gas treatment method that uses the same in accordance with some embodiments of the present inventive concepts, a dielectric barrier discharge (DBD) plasma reactor is used to decompose a fluorinated compound in a gas. Accordingly, a fluorinated compound that has not decomposed in a regenerative catalytic oxidizer is decomposed before the gas is discharged. Therefore, the regenerative catalytic oxidizer has a reduced load. Therefore, a two-bed regenerative catalytic reactor is used as the regenerative catalytic oxidizer. The two-bed regenerative catalytic reactor has a relatively simplified configuration. Accordingly, the lifespan and maintenance period of the equipment can be increased.

According to a gas treatment system and a gas treatment method that uses the same in accordance with some embodiments of the present inventive concepts, a cooling section cools the gas before a cleaning section of a second scrubber receives the gas from the regenerative catalytic oxidizer. Therefore, even though the gas discharged from the regenerative catalytic oxidizer has a high temperature, the second scrubber is prevented from being damaged. For example, a process is continuously performed even when the gas has a high temperature immediately after passing through the regenerative catalytic oxidizer. The regenerative catalytic oxidizer exhausts gas at a high temperature. Accordingly, the regenerative catalytic oxidizer is prevented from condensation at a rear end thereof, and thus equipment is protected.

According to a gas treatment system and a gas treatment method that uses the same in accordance with some embodiments of the present inventive concepts, particles in the gas are eliminated in advance before the gas is introduced into a first scrubber. Hence, the first scrubber is protected from damage and has an increased lifetime.

Figure 15:
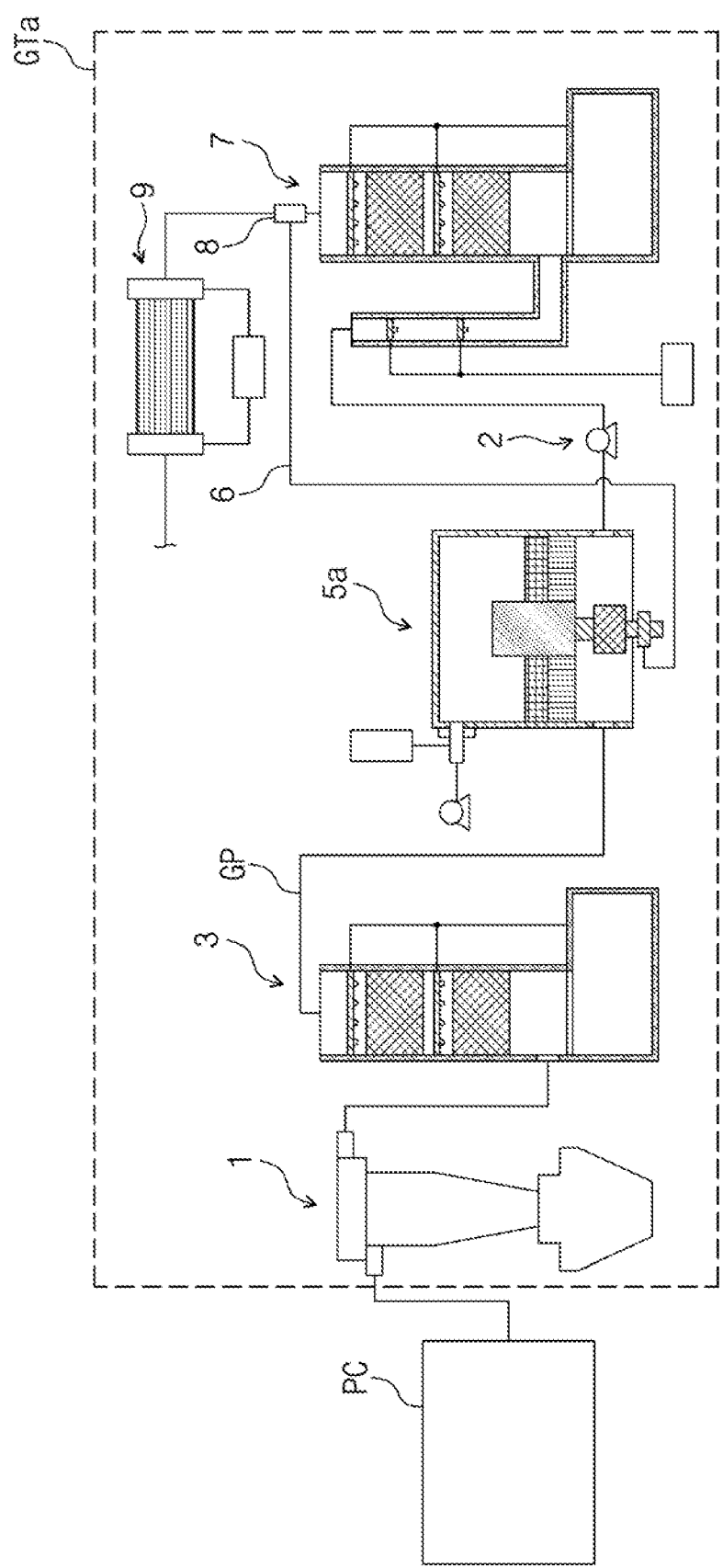
FIG. 15 illustrates a gas treatment system according to some embodiments of the present inventive concepts.

FIG. 15 illustrates a gas treatment system according to some embodiments of the present inventive concepts.

The following may omit a description of contents substantially the same as or similar to that discussed with reference to FIGS. 1 to 14.

Referring to FIG. 15, in some embodiments, a gas treatment system GTa is provided. Different from that discussed with reference to FIG. 1, a regenerative catalytic oxidizer 5a of the gas treatment system GTa includes a rotary regenerative catalytic reactor. In addition, the gas treatment system GTa further includes a splitter 8 and a bypass pipe 6.

The splitter 8 is positioned between the second scrubber 7 and the DBD plasma reactor 9. The splitter 8 splits the gas that has passed through the second scrubber 7. One side of the splitter 8 is connected to the DBD plasma reactor 9. Another side of the splitter 8 is connected the regenerative catalytic oxidizer 5a. For example, the bypass pipe 6 connects the splitter 8 to the regenerative catalytic oxidizer 5a while bypassing the second scrubber 7. Therefore, a portion of the gas that has passed through the second scrubber 7 returns through the bypass pipe 6 to the regenerative catalytic oxidizer 5a. The regenerative catalytic oxidizer 5a is purged by the gas that has flows through the bypass pipe 6. A detailed description thereof will be further provided below.

Figure 16:
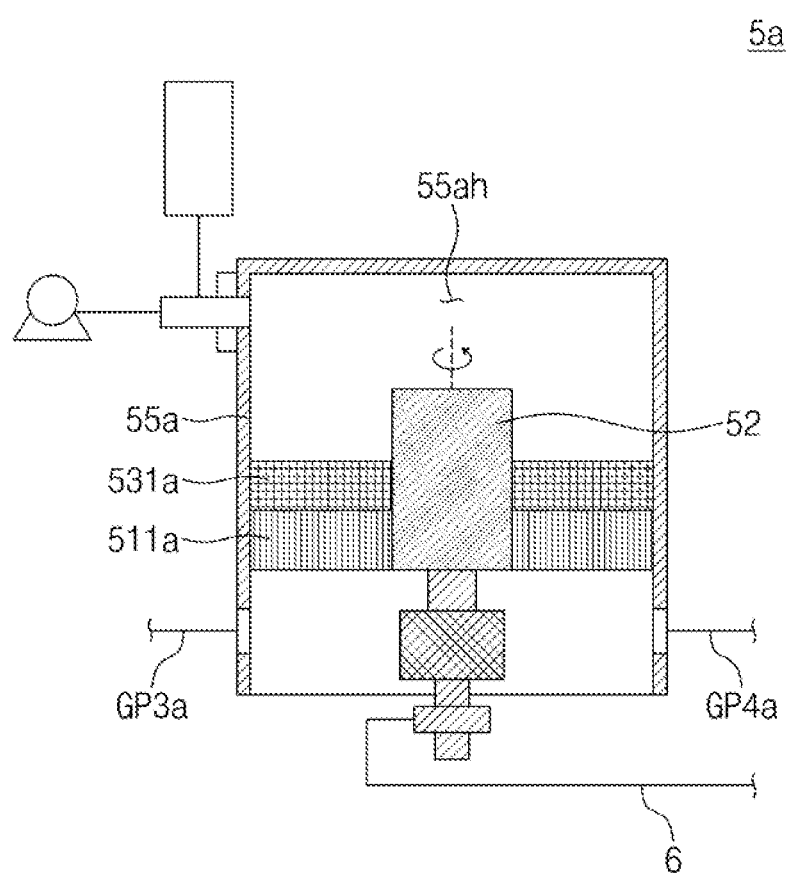
FIG. 16 is a cross-sectional view of a regenerative catalytic oxidizer according to some embodiments of the present inventive concepts.

FIG. 16 is a cross-sectional view of a regenerative catalytic oxidizer according to some embodiments of the present inventive concepts.

Referring to FIG. 16, in some embodiments, the regenerative catalytic oxidizer 5a includes a combustion chamber 55a, a rotating member 52, a catalytic layer 531a, and a heat storage medium 511a.

The combustion chamber 55a provides a combustion space 55ah. Gas in introduced into the combustion space 55ah from gas pipe GP3a, and is discharged into gas pipe GP4a. The rotating member 52 rotates around a vertical axis thereof. The rotation of the rotating member 52 rotates the gas that passes through the combustion space 55ah.

The catalytic layer 531a surrounds the rotating member 52. The catalytic layer 531a includes a material that is substantially the same as or similar to that of the first catalytic layer 531 described with reference to FIG. 4.

The heat storage medium 511a is positioned below the catalytic layer 531a. The heat storage medium 511a surrounds the rotating member 52. The heat storage medium 511a rotates together with the rotating member 52. The heat storage medium 511a includes a material that is substantially the same as or similar to that described with reference to FIG. 4. Although the rotating member 52 is described as rotating the gas, embodiments of the present inventive concepts are not necessarily limited thereto. For example, a valve rotary manner or any other suitable manner can be used to rotate the gas that passes through the combustion space 55ah.

Figure 17:
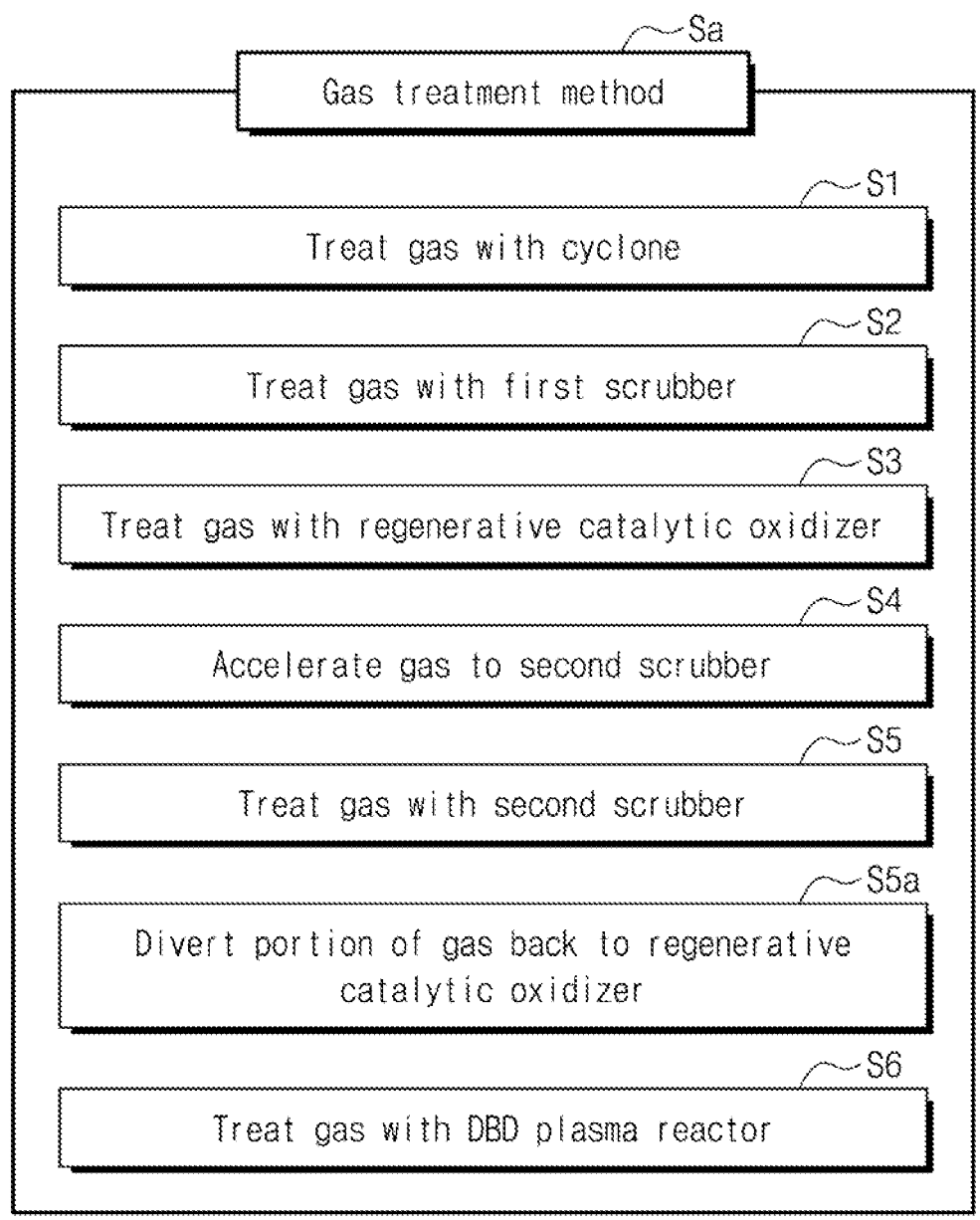
FIG. 17 is a flow chart of a gas treatment method according to some embodiments of the present inventive concepts.

FIG. 17 is a flow chart of a gas treatment method according to some embodiments of the present inventive concepts.

Referring to FIG. 17, in some embodiments, a gas treatment method Sa may be provided. Different from the gas treatment method S described with reference to FIG. 9, the gas treatment method Sa of FIG. 17 further includes a step of using a regenerative catalytic oxidizer to receive a portion of gas that has passed through a second scrubber.

The following may omit a description of steps substantially the same as or similar to those discussed with reference to FIG. 9. Hereinafter, some steps of the gas treatment method Sa of FIG. 17 will be described with reference to FIG. 18.

Figure 18:
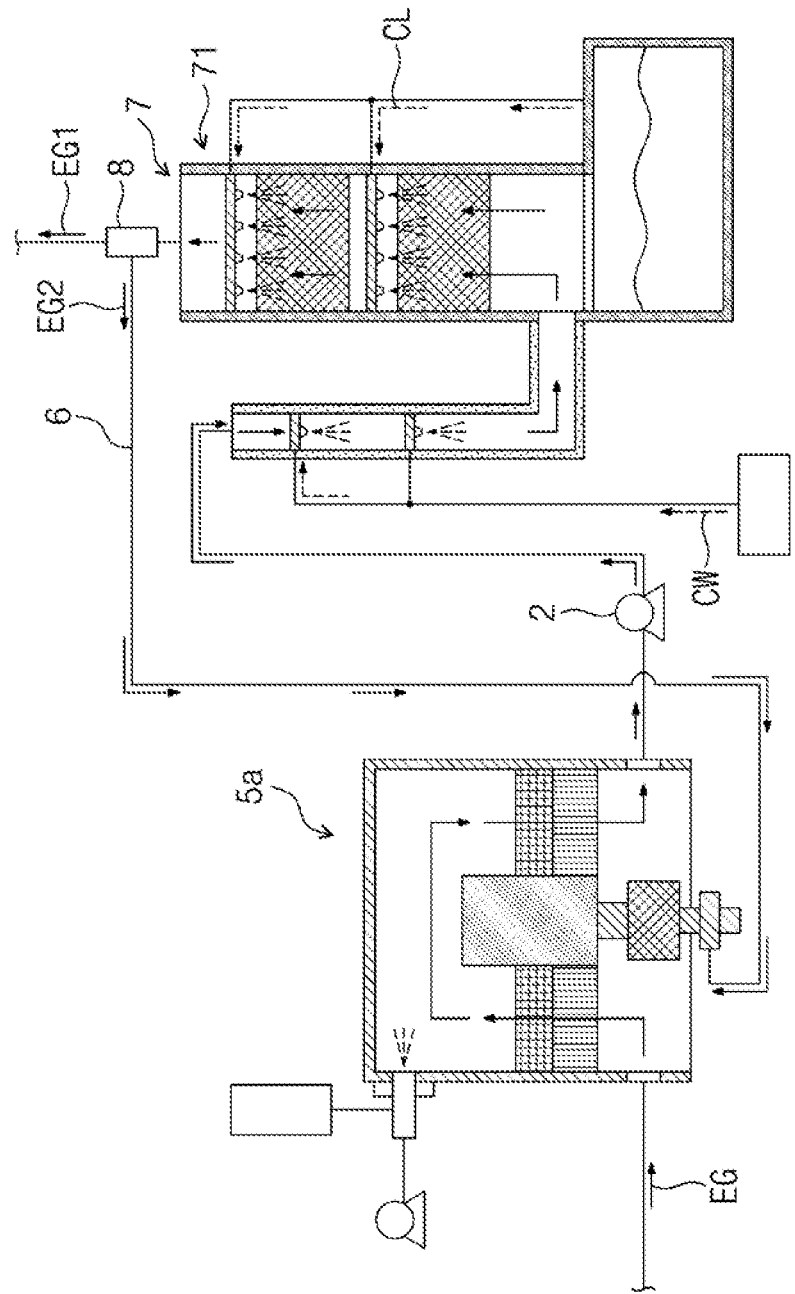
FIG. 18 illustrates a gas treatment method in accordance with a flow chart of FIG. 17.

FIG. 18 illustrates a gas treatment method in accordance with the flow chart of FIG. 17.

Referring to FIGS. 17 and 18, in some embodiments, step S3a include using the rotary typed regenerative catalytic oxidizer 5a to decompose the fluorinated compounds (FC) in the gas EG.

Step S5a include using the splitter 8 to divert a portion EG1 of the gas EG to flow to the DBD plasma reactor 9 of FIG. 15 and divert another portion EG2 of the gas EG to flow to the regenerative catalytic oxidizer 5a. The portion EG2 of the gas EG flows through the bypass pipe 6 to the regenerative catalytic oxidizer 5a, purging the regenerative catalytic oxidizer 5a. Although the gas that has passed through the second scrubber 7 is described as purging the regenerative catalytic oxidizer 5a, embodiments of the present inventive concepts are not necessarily limited thereto. For example, in an embodiment, air is used to purge the regenerative catalytic oxidizer 5a.

According to a gas treatment system and a gas treatment method that uses the same in accordance with some embodiments of the present inventive concepts, because an intermediate blower accelerates the gas, a portion of the gas that has passed through a second scrubber is split and returned to a regenerative catalytic oxidizer. Therefore, no separate fluid is supplied to purge the regenerative catalytic oxidizer. Accordingly, the system facilities are simplified and costs are reduced.

According to a gas treatment system and a gas treatment method that uses the same in accordance with the present inventive concepts, cost may be reduced.

According to a gas treatment system and a gas treatment method that uses the same in accordance with the present inventive concepts, a lifespan of the equipment is increased.

According to a gas treatment system and a gas treatment method that uses the same in accordance with the present inventive concepts, a maintenance period can be increased.

Effects of embodiments of the present inventive concepts are not limited to the mentioned above, other effects which have not been mentioned above will be clearly understood to those skilled in the art from the preceding description.

Although embodiments of the present inventive concepts have been described in connection with the accompanying drawings, it will be understood to those skilled in the art that various changes and modifications may be made without departing from the technical spirit and essential feature of embodiments of the present inventive concepts. It therefore will be understood that embodiments described above are just illustrative but not limitative in all aspects.

What is claimed is:

1. A gas treatment system, comprising:
   a first scrubber;
   a regenerative catalytic oxidizer (RCO) that treats gas received from the first scrubber;
   a second scrubber that treats the gas received from the regenerative catalytic oxidizer; and
   a dielectric barrier discharge (DBD) plasma reactor that treats the gas received from the second scrubber,
   wherein the regenerative catalytic oxidizer includes a two-bed regenerative catalytic reactor.

2. The gas treatment system of claim 1, wherein the regenerative catalytic oxidizer includes;
   a first heat storage medium;
   a first catalytic layer positioned on the first heat storage medium;
   a second heat storage medium spaced apart from the first heat storage medium;
   a second catalytic layer positioned on the second heat storage medium;
   a combustion chamber that provides a combustion space above and between the first catalytic layer and the second catalytic layer, and
   a combustion apparatus.

3. The gas treatment system of claim 2, wherein the combustion chamber includes:
   an inner wall that surrounds the combustion space;
   a steel layer coupled to an outer side of the inner wall; and
   an outer adiabatic layer that surrounds the steel layer,
   wherein the outer adiabatic layer is outwardly spaced apart from the steel layer such that an adiabatic space is formed between the steel layer and the outer adiabatic layer.

4. The gas treatment system of claim 3, wherein the combustion chamber includes:
   a first temperature sensor coupled to the steel layer; and
   a second temperature sensor in the adiabatic space.

5. The gas treatment system of claim 1, wherein the second scrubber includes:
   a cleaning section that sprays cleaning water to treat the gas; and
   a cooling section between the cleaning section and the regenerative catalytic oxidizer,
   wherein the cleaning section includes:
      a cleaning housing that provides a cleaning space;
      a packing member in the cleaning space; and
      a cleaning nozzle that sprays the cleaning water into the cleaning space,
   wherein the cooling section includes:
      a cooling housing that provides a cooling space; and
      a cooling nozzle that sprays cooling water into the cooling space,
   wherein a lower portion of the cooling housing and a lower portion of the cleaning housing are coupled and connect the cooling space and the cleaning space to each other.

6. The gas treatment system of claim 1, further comprising a cyclone connected to the first scrubber, wherein the cyclone receives a gas discharged from a semiconductor process chamber decomposes a particle in the gas before the gas flows to the first scrubber.

7. The gas treatment system of claim 1, wherein the DBD plasma reactor includes a plasma generator,
   wherein the plasma generator includes:
      an inner electrode that extends in a first direction; and
      an outer electrode that extends in the first direction and surrounds the inner electrode,
   wherein an inner surface of the outer electrode is spaced apart from an outer surface of the inner electrode such that a gas treatment path is formed between the outer electrode and the inner electrode,
   wherein the gas treatment path is connected to an internal space of the second scrubber.

8. A gas treatment system, comprising:
   a first scrubber;
   a regenerative catalytic oxidizer (RCO) connected to the first scrubber; and
   a second scrubber connected to the regenerative catalytic oxidizer,
   wherein the regenerative catalytic oxidizer includes a rotary regenerative catalytic reactor.

9. The gas treatment system of claim 8, further comprising a dielectric barrier discharge (DBD) plasma reactor connected to the second scrubber.

10. The gas treatment system of claim 9, further comprising a splitter positioned between the second scrubber and the DBD plasma reactor,
    wherein one side of the splitter is connected to the DBD plasma reactor, and
    wherein another side of the splitter is connected to the regenerative catalytic oxidizer while bypassing the second scrubber.

11. The gas treatment system of claim 8, further comprising an intermediate blower positioned between the regenerative catalytic oxidizer and the second scrubber, wherein the intermediate blower accelerates the gas flowing into the second scrubber.

12. The gas treatment system of claim 9, wherein the DBD plasma reactor includes a plasma generator,
    wherein the plasma generator includes:
       an inner electrode that extends in a first direction; and
       an outer electrode that extends in the first direction and surrounds the inner electrode,
    wherein an inner surface of the outer electrode is spaced apart from an outer surface of the inner electrode such that a gas treatment path formed is between the outer electrode and the inner electrode,
    wherein the gas treatment path is connected to an internal space of the second scrubber.

13. A gas treatment system, comprising:
    a first scrubber that treats a gas discharged from a semiconductor process chamber;
    a regenerative catalytic oxidizer connected to the first scrubber, wherein the regenerative catalytic oxidizer decomposes a fluorinated compound (FC) in the gas received from the first scrubber;
    a second scrubber connected to the regenerative catalytic oxidizer, wherein the second scrubber treats the gas received from the regenerative catalytic oxidizer; and a dielectric barrier discharge (DBD) plasma reactor connected to the second scrubber.

14. The gas treatment system of claim 13, wherein the DBD plasma reactor includes a plasma generator,
wherein the plasma generator includes:
an inner electrode that extends in a first direction; and
an outer electrode that extends in the first direction and surrounds the inner electrode,
wherein an inner surface of the outer electrode is spaced apart from an outer surface of the inner electrode such that a gas treatment path is formed between the outer electrode and the inner electrode,
wherein the gas treatment path is connected to an internal space of the second scrubber.

15. The gas treatment system of claim 14, wherein the plasma generator further includes a dielectric layer that extends in the first direction,
wherein the dielectric layer is positioned between the inner electrode and the outer electrode.

16. The gas treatment system of claim 14, wherein the plasma generator further includes a cooling pipe that extends in the first direction and surrounds the outer electrode,
wherein an inner surface of the cooling pipe is spaced apart from an outer surface of the outer electrode such that a cooling path is formed between the cooling pipe and the outer electrode.

17. The gas treatment system of claim 14, wherein the plasma generator is includes a plurality of plasma generators,
wherein the plurality of plasma generators are spaced apart from each other in a direction that intersects the first direction.

18. A gas treatment method, comprising:
treating a gas discharged from a semiconductor process chamber using a first scrubber;
treating the gas that passed through the first scrubber with a regenerative catalytic oxidizer (RCO);
treating the gas that passed through the regenerative catalytic oxidizer with a second scrubber; and
treating the gas that passed through second scrubber with a dielectric barrier discharge (DBD) plasma reactor.

19. The gas treatment method of claim 18, wherein treating the gas with the regenerative catalytic oxidizer (RCO) includes:
applying heat to the gas when the gas passes through a heat storage medium;
passing the gas that passed through the heat storage medium through a catalytic layer; and
heating the gas that passed through the catalytic layer in a combustion chamber.

20. The gas treatment method of claim 19,
wherein treating the gas with the second scrubber includes:
spraying, by a cooling section of the second scrubber, cooling water into the gas; and
spraying, by a cleaning section of the second scrubber, cleaning water into the gas that passed through the cooling section,
wherein the cooling section is positioned between the cleaning section and the regenerative catalytic oxidizer.

* * * * *